US010990626B2

(12) United States Patent
Sclaroff et al.

(10) Patent No.: US 10,990,626 B2
(45) Date of Patent: Apr. 27, 2021

(54) DATA STORAGE AND RETRIEVAL SYSTEM USING ONLINE SUPERVISED HASHING

(71) Applicant: Trustees of Boston University, Boston, MA (US)

(72) Inventors: Stanley Sclaroff, Boston, MA (US); Fatih Cakir, Allston, MA (US); Kun He, Providence, RI (US)

(73) Assignee: Trustees of Boston University, Boston, MA (US)

( * ) Notice: Subject to any disclaimer, the term of this patent is extended or adjusted under 35 U.S.C. 154(b) by 124 days.

(21) Appl. No.: 15/754,904

(22) PCT Filed: Sep. 23, 2016

(86) PCT No.: PCT/US2016/053414
§ 371 (c)(1),
(2) Date: Feb. 23, 2018

(87) PCT Pub. No.: WO2017/053779
PCT Pub. Date: Mar. 30, 2017

(65) Prior Publication Data
US 2018/0246985 A1    Aug. 30, 2018

Related U.S. Application Data

(60) Provisional application No. 62/232,001, filed on Sep. 24, 2015.

(51) Int. Cl.
*G06F 7/00* (2006.01)
*G06F 17/30* (2006.01)
(Continued)

(52) U.S. Cl.
CPC ............ *G06F 16/9014* (2019.01); *G06F 7/00* (2013.01); *G06F 12/16* (2013.01); *G06F 16/23* (2019.01);
(Continued)

(58) Field of Classification Search
CPC .............. G06F 17/30949; G06F 15/18; G06F 17/30002; G06F 17/30979
(Continued)

(56) References Cited

U.S. PATENT DOCUMENTS 7,085,988 B1 *  8/2006  Weng .................... H04L 9/0643
708/492
7,168,025 B1 *  1/2007  Berkovich .......... G06F 16/2255
714/759

(Continued)

OTHER PUBLICATIONS

Robert E. Schapire, "BoosTexter: A Boosting-based System for Text Categorization". 2000 (Year: 2000).*
(Continued)

*Primary Examiner* — Binh V Ho
(74) *Attorney, Agent, or Firm* — BainwoodHuang

(57) ABSTRACT

A data storage and retrieval system employs online supervised hashing for indexing a data set and retrieving data items therefrom. A hash-based mapping is used to generate hash codes for indexing content items. Data items may be retrieved based on either/both a query label (using corresponding codewords) and the content item itself (using the hash codes). The hash-based mapping is updated using an objective function of distance between the hash codes and respective codewords for labels of labelled content items, preserving semantic similarities of content items. The codewords may be error-correcting codes. Techniques for efficiently updating the index include (1) cycle-based updating and ternary codewords, and (2) reservoir sample-based method of determining when to trigger an update.

23 Claims, 3 Drawing Sheets

(51) Int. Cl.
  *G06F 16/901* (2019.01)
  *G06N 20/00* (2019.01)
  *G06F 16/23* (2019.01)
  *G06F 16/903* (2019.01)
  *H03M 13/09* (2006.01)
  *G06F 12/16* (2006.01)

(52) U.S. Cl.
  CPC ....... *G06F 16/90335* (2019.01); *G06N 20/00* (2019.01); *H03M 13/095* (2013.01)

(58) Field of Classification Search
  USPC .......................................................... 707/741
  See application file for complete search history.

(56) References Cited

U.S. PATENT DOCUMENTS

| | | |
|---|---|---|
| 7,257,672 B2 | 8/2007 | Shoham et al. |
| 7,617,231 B2 | 11/2009 | Moon et al. |
| 7,761,466 B1* | 7/2010 | Eshghi ................... G06K 9/46 707/772 |
| 7,797,265 B2 | 9/2010 | Brinker et al. |
| 7,831,531 B1 | 11/2010 | Baluja et al. |
| 8,010,466 B2 | 8/2011 | Patinkin |
| 8,914,371 B2 | 12/2014 | Aggarwal et al. |
| 2005/0076022 A1* | 4/2005 | Wu ....................... G06F 16/951 |
| 2006/0059173 A1* | 3/2006 | Hirsch ................ G06F 11/1453 |
| 2010/0257181 A1 | 10/2010 | Zhou et al. |
| 2011/0271067 A1* | 11/2011 | Chou ................... G06F 11/1464 711/162 |
| 2013/0007700 A1* | 1/2013 | Villar ....................... G06F 8/33 717/109 |
| 2014/0278884 A1* | 9/2014 | Schuler ................. G06Q 40/06 705/14.27 |
| 2014/0325012 A1* | 10/2014 | Guerin ................. G06F 15/173 709/212 |
| 2015/0317323 A1* | 11/2015 | Wang ................... G06F 16/137 707/747 |
| 2016/0094553 A1* | 3/2016 | Azgin ................. H04L 45/7453 713/154 |

OTHER PUBLICATIONS

"Supervised Hashing with Error Correcting Codes", F. Cakir and S. Sclaroff, In Proc. of the ACM International Conf. on Multimedia, 2014.
"Online Hashing", Long-Kai Huang, Qiang Yang and Wei-Shi Zheng, In Proc. International Joint Conference on Artificial Intelligence (IJCAI), 2013.
"BoosTexter: A Boosting-based System for Text Categorization", Schapire et al., Machine Learning, 39, 135-168, 2000.

\* cited by examiner $$\Phi(\mathbf{x}_Q) = [-1,\ldots,+1,-1,-1,+1,-1,\ldots+1] \quad \text{Test Query}$$

$$(\mathbf{x}_1, y_1) \rightarrow \mathbf{c}_{y1} = [\underbrace{-1,\ldots,+1}_{k}, -0-, -0-]$$

$$(\mathbf{x}_2, y_2) \rightarrow \mathbf{c}_{y2} = [-0-, \underbrace{+1,\ldots,+1}_{k}, -0-]$$

$$(\mathbf{x}_3, y_3) \rightarrow \mathbf{c}_{y3} = [-0-, -0-, \underbrace{-1,\ldots+1}_{k}]$$

$$\mathbf{x}_4 \rightarrow \Phi(\mathbf{x}_4) = [+1,\ldots,-1,-1,-1,-1,+1,\ldots+1]$$

Index

Fig. 4

DATA STORAGE AND RETRIEVAL SYSTEM USING ONLINE SUPERVISED HASHING

BACKGROUND

The present invention is related to the field of data processing systems, and in particular to data storage and retrieval systems for storing/retrieving data objects to/from a dataset. Even more particularly, the present invention relates to data storage and retrieval systems employing methods of organizing, indexing and searching datasets.

A search technique called "similarity search" lies at the heart of many data processing applications, and as datasets continue to grow and diversify, expediting the similarity search process is becoming increasingly challenging and important. One promising family of approaches is based on hashing, in which data is mapped to binary vectors in a Hamming space using binary representations that permit fast searching with a low memory footprint. Applications utilizing this approach include: image annotation, visual tracking, 3D reconstruction, video segmentation, and object detection.

Hashing methods can be categorized broadly as data-independent and data-dependent techniques. Locality Sensitive Hashing methods are examples of data-independent methods; they give guarantees on the approximation to particular metrics, without regard to the dataset to be indexed. For certain application settings, distances are defined only on the available data set; thus, solutions are required for learning the hash codes directly from data. Data-dependent solutions include: methods that approximate pair-wise distances via quantization or spectral graph analysis, methods that leverage available label information for semantic retrieval, and semi-supervised methods that utilize both the data distribution and available label information.

Hashing schemes constructed via data-dependent techniques tend to yield superior retrieval performance, primarily through use of a learning phase in which properties like compactness and informativeness of the resulting binary codes are enforced. The computational cost of learning may become excessive when large-scale datasets are considered; most methods are batch-learners and slow. Moreover, with batch learning it is difficult to adapt to variations in the dataset as it grows. Many applications require that the hash mappings be versatile given such changes as it would be extremely costly to do learning from scratch.

SUMMARY

In hash-based search techniques, it may be important that the hash codes offer certain properties such as: (1) easily computed for novel data points and (2) use a minimal number of bits to represent the data. For so-called "online" datasets, i.e., those that are added to indefinitely, the hash codes should also be amenable to the continued growth of the dataset. In this work, an online supervised method is proposed for learning hash codes that satisfy all three properties. A disclosed formulation is based on Error Correcting Output Codes (ECOCs). More generally, the codewords may be any set of codes that has application-specific desirable properties that promote selectivity of the hash codes that are produced by the hash-based mapping, such as good separation (distance) in a Hamming space, independence of bits of the codes (i.e. not assigning the same bit value in a certain position for the codes), etc. Such codewords are generally referred to as "error correcting codes" herein.

The disclosed online method may be significantly faster than batch-learning of hashing parameters, and being online it is adaptable to variations in the incoming data. In particular, the disclosed method may operate in a stochastic environment in which the hash mappings are updated according to sequentially arriving data, and the number of labels (corresponding to distinct groupings or classes of data/content items) is not known a priori.

A data storage and retrieval system and corresponding method are disclosed. The system maintains a hash-based mapping (learned in an online manner from labelled data) independent of the type(s) of indexing used to index data/content items. A query is accompanied by a query content item which may or may be labelled. The hash-based mapping is used to compute a hash code for the query content item, and that hash code is used to retrieve stored content items, e.g., by computing the Hamming distance between this hash code and the hash codes/indexes in an index structure, and retrieving content items based on this computed distance.

The index structure contains index values for content items that may have been inserted to the index structure in one of several ways:

(1) The hash-based mapping is used to calculate a hash code from the content item, and the hash code is used as an index value;

(2) If the content item has label information associated with it, a corresponding ECOC can be looked up and used as an indexing value;

(3) If the content item has label information associated with it, the content item can be indexed into two separate index structures, one based on the corresponding ECOC of the label, the other based on the hash code generated by the hash-based mapping;

Given a query, retrieval may be done in a variety of ways, some of which are explained below. In one case, retrieval is done by first comparing the hash code for a content item of the query (generated by the hash-based mapping) to the index values in the first index structure (ECOC-based) and identifying the closest items. These items can then be re-ranked using by comparing the hash code for the content items to the index value in the second index (hash-code-based) and identifying the closes items.

More particularly, a data storage and retrieval system is disclosed that includes a storage subsystem and a processing subsystem. The storage subsystem stores a dataset of content items, at least some of the content items of the dataset being labelled content items having respective labels describing respective aspects of the content items. The processing subsystem is coupled to the storage subsystem and has a communications interface coupled to receive additions to the dataset and queries of the dataset. The processing subsystem being configured and operative to:

maintain an index of the content items using hash codes and predetermined codewords as index values, the codewords representing respective labels of the labelled content items of the dataset, the codewords being error-correcting codes promoting selectivity of the hash codes produced by the hash-based mapping;

maintain a hash-based mapping and use the hash-based mapping to generate the hash codes as content items of the dataset are indexed, the hash-based mapping preserving semantic similarities of content items, the hash-based mapping being updated using an objective function of distance between the hash codes produced by the hash-based mapping and respective codewords for the labelled content items; and search the index to retrieve stored content items in response to the queries received via the communications interface, including (i) using the hash-based mapping to calculate a query hash code from a content item of the query, and (ii) use the query hash code to retrieve stored content items indexed by similar codewords or hash codes.

In some embodiments, to maintain the hash-based mapping the processing subsystem performs a calculation minimizing an upper bound on a Hamming loss between the hash codes and the codewords.

In some embodiments, the processing subsystem (i) maintains a reservoir sampling set of selected content items and associated labels added to the dataset during operation, (ii) uses the reservoir sampling set to determine when to update the index, and (iii) updates the index at determined times. To determine when to update the index, the processing subsystem may perform a calculation comparing a measure of an amount of change of the hash codes of the reservoir to a predetermined threshold value. The threshold may be a dynamic threshold adapted based on the number of labels observed in preceding operation.

In some embodiments, to maintain the hash-based mapping the processing subsystem evaluates a regularizer term in addition to the objective function of distance, the regularizer term encoding a measure of divergence between a current hash-based mapping and a candidate new hash-based mapping to promote selection of a new hash-based mapping requiring less updating of the index than other candidate new hash-based mappings. The processing subsystem may maintain a reservoir sampling set of selected content items and associated labels added to the dataset during operation, and uses the reservoir sampling set to evaluate the regularizer term. The processing subsystem may also use the reservoir sampling set to determine when to update the index, and updates the index at determined times. To determine when to update the index, the processing subsystem may perform a calculation comparing a measure of an amount of change of the hash codes of the reservoir to a predetermined threshold value. The threshold may be a dynamic threshold adapted based on the number of labels observed in preceding operation.

In some embodiments, to maintain the index and maintain the hash-based mapping, the processing subsystem performs ongoing processes divided into cycles during each of which a number of new labels are learned and corresponding content items are stored, both the hash-based mapping and the index being divided into sections corresponding to the cycles during which respective hash functions and codewords of the sections were first created and stored therein, the processes including, at a time of updating the hash-based mapping and the index based on adding a new labelled content item to the dataset:

identifying respective sections of the hash-based mapping and index structure corresponding to a codeword for a label of the labelled content item; and updating the identified sections.

In such embodiments, the codewords may comprise ternary symbols including an inactive value, and wherein, to update the identified sections, the processing subsystem also updates other sections of the index structure by appending a series of symbols having the inactive value to existing symbols of existing hash codes.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views.

FIG. 4 is a depiction of respective codes for a query and stored content items according to a cycle-based scheme updating scheme.

DETAILED DESCRIPTION

A technique for organizing and searching datasets employs online supervised hashing, where "supervised" refers to labelling of dataset contents, and "online" refers to continual growth of the dataset and corresponding adaptation of the organization and searching.

The technique may be incorporated into a variety of different types of applications, including for example image storage/retrieval using datasets with images labelled in some manner, e.g., according to a classification scheme. Other possible applications include document storage/retrieval; records storage/retrieval such as medical records, legal records, etc.; media storage/retrieval (e.g., audio); and storage/retrieval of scientific data such as genome libraries, etc.

Key aspects of the disclosed technique are the following:
1. Use of a hashing technique with codes corresponding to labels and drawn from a non-fixed, growing set of codes
2. Use of optimization to provide bounded Hamming loss
3. Use of error correcting codes for improved error tolerance
4. An efficient update scheme that limits the number of whole-index updates based on reservoir sampling and use of a threshold defined on the reservoir sampled set.
5. An alternative updating scheme that avoids whole-index updates by a sectioning technique that limits the extent of entries needing updating.

Figure 1:
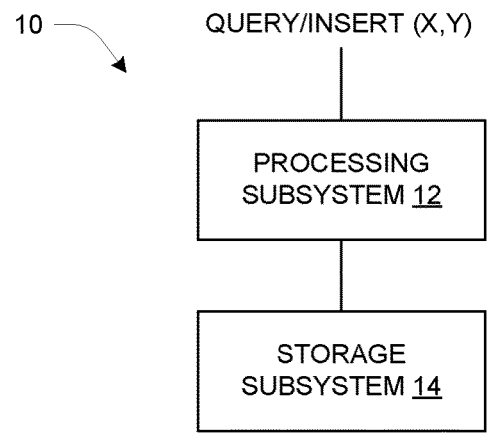
FIG. 1 is a high-level block diagram of a data storage and retrieval system.

FIG. 1 shows a data storage and retrieval system 10 including a processing subsystem 12 and a storage subsystem 14. The storage subsystem 14 stores a collection, referred to herein as a "dataset", of content items. These may be data objects such as documents, images, media (audio, video) files/objects, etc. At least some of the content items are "labelled", i.e., they carry one or more descriptive labels. Labels may be taken from one or many domains, depending on the application. To illustrate, the system 10 may be used in a fingerprint storage/retrieval system, in which case the labels may pertain to one or more aspects of fingerprint images. In a more general-purpose application such as a store for personal photographs, the labels might be drawn from several distinct domains such as given names, place names, type of object(s) in an image, etc. The processing subsystem 12 handles operations upon the dataset such as query and insert operations (shown as QUERY/INSERT) from a separate application/system, where "query" refers to a request to retrieve one or more stored items and "insert" refers to a request to add one or more items to the dataset.

It will be appreciated that both the processing subsystem 12 and storage subsystem 14 may be realized by respective physical computers having computer hardware including one or more processors, memory, and interface circuitry interconnected by data interconnections such as one or more high-speed data buses. The interface circuitry provides a hardware connection to an external network and perhaps other external devices/connections. There may also be local storage such as a local-attached disk drive or Flash drive, in addition to a larger physical data store provided by the storage subsystem 14 for the dataset. In operation, the memory stores data and instructions of system software (e.g., operating system) and one or more application programs which are executed by the processor(s) to cause the hardware to function in a software-defined manner. Thus the computer hardware executing instructions of a dataset search application, for example, can be referred to as a dataset search component, and it will be understood that a collection of such components can all be realized and interact with each other as one or more sets of computer processing hardware executing different computer programs as generally known in the art. Further, the application software may be stored on a non-transitory computer-readable medium such as an optical or magnetic disk, Flash memory or other non-volatile semiconductor memory, etc., from which it is retrieved for execution by the processing circuitry, as also generally known in the art.

Figure 2:
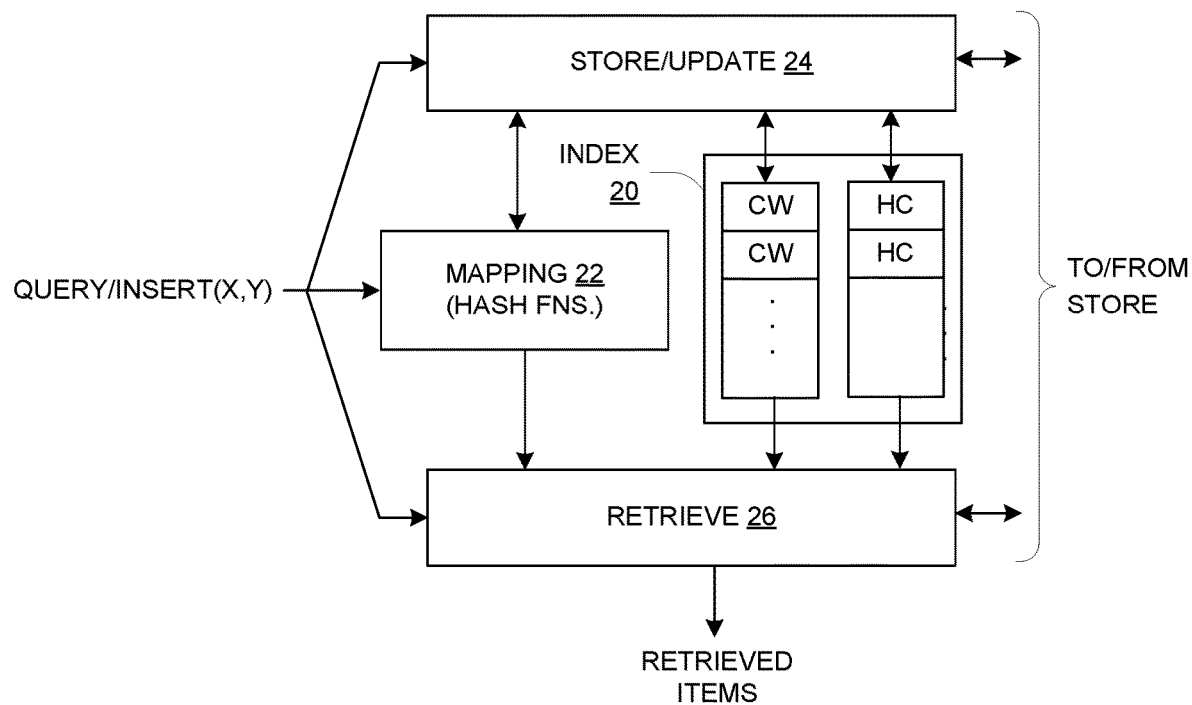
FIG. 2 is a more detailed functional block diagram of a data storage and retrieval system.

FIG. 2 shows the system 10 in greater detail as a collection of functional components including an index component 20, a mapping component 22, a store/update component 24, and a retrieve component 26. QUERY/INSERT (X, Y) refers to a content item being the subject of a search or being added (inserted) to the dataset, with X being the actual content (e.g., an image) and Y being a set of one or more labels for the content. As described below, in different uses one of X or Y may not be provided for some operations. In the present description, Y is assumed singular without loss of generality. Content items may carry multiple distinct labels, and in such case the presence of multiple distinct labels is handled in some appropriate manner. In one example, every distinct combination of such distinct labels can be treated as a unitary super-label, which would be represented by Y in this description. In another example, multiple codewords are used for all content items having multiple labels, and the operations herein are performed with respect to each codeword.

The following are high-level descriptions of the components shown in FIG. 2; further details are provided in the description that follows:

INDEX 20: Index for stored content items of dataset stored in storage subsystem 14, also referred to as "store". Stored content items are organized into bins with content and label for all content items. The index 20 may be organized into two distinct sub-indexes, one using the ECOC codewords (CW) as index values, the other using the hash codes (HC) generated by the mapping 22.

MAPPING 22: Set of hash functions mapping a content item to a hash code. The mapping is identified as 1 in the description below, and is also referred to herein as a "hash mapping" or "hash-based mapping".

STORE/UPDATE 24: Structure and functionality for adding content items to the dataset and updating the mapping and index as necessary.

RETRIEVE 26: Structure and functionality for identifying stored content items based on the Query. Retrieval can be accomplished by querying the index 20 with the query hash code. The index 20 can contain both codeword-based and hash mapping based indexes.

Figure 3:
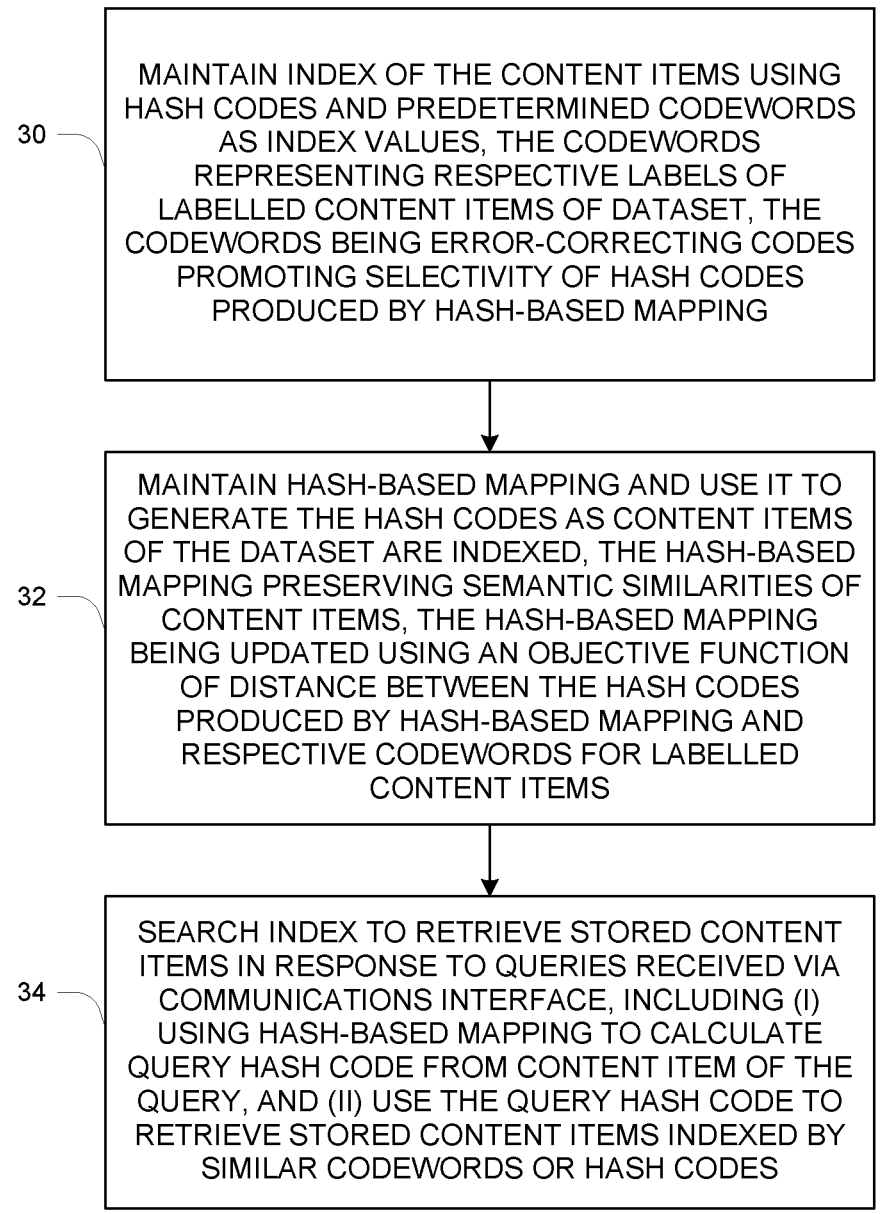
FIG. 3 is a high-level flow diagram of operation.

FIG. 3 shows operation of the system 10, and specifically the processing subsystem 12, at a high level. More detailed description follows.

At 30, the processing subsystem 12 maintains an index of the content items using hash codes and predetermined codewords as index values. The codewords represent respective labels of the labelled content items of the dataset, and the codewords are error-correcting codes promoting selectivity of the hash codes produced by the hash-based mapping.

At 32, the processing subsystem 12 maintains a hash-based mapping and uses it to generate the hash codes as content items of the dataset are indexed. The hash-based mapping preserves semantic similarities of content items, and is updated using an objective function of distance between the hash codes produced by the hash-based mapping and respective codewords for the labelled content items.

At 34, the processing subsystem 12, searches the index to retrieve stored content items in response to the queries received via the communications interface, including (i) using the hash-based mapping to calculate a query hash code from a content item of the query, and (ii) use the query hash code to retrieve stored content items indexed by similar codewords or hash codes.

Detailed Description of Basic Organization and Operation

As mentioned, the present disclosure is directed to expediting search for datasets that continue to grow and diversify. In particular, disclosed techniques are based on the approach of hashing, in which data is mapped to binary vectors in Hamming space using binary representations that permit fast search mechanisms with a very low memory footprint. Example applications utilizing this approach include: image retrieval/annotation, audio retrieval, document retrieval, visual tracking, 3D reconstruction, video segmentation, and object detection. Dataset contents are referred to generally as "content items", as well as "instances" and "points".

Of particular interest is the task of retrieving semantically similar neighbors for a given query. This task has its use in many applications including label-based image retrieval and annotation, semantic segmentation, image super resolution, etc. For this task, supervised hashing methods tend to offer superior performance, mainly due to leveraging label information in learning the hash functions.

Specifically, there is use of labels having distinct categorical identities. In operation, the goal is to retrieve instances that share the same label(s) with the query. In the stochastic environment the hash mappings are updated according to sequentially incoming data with the use of ECOCs. No prior information on the label space is assumed. The arriving data can be associated with possibly previously unseen labels and the hash functions are accommodated to such variations. The supervised hashing method allows the label space to grow.

Data points are denoted $\{(x_1, y_1)\}$ where $x \in \mathcal{X}$ denotes an instance in the feature space $\mathcal{X}$ and $y \subseteq \mathcal{Y}$ is a subset of the label space $\mathcal{Y}$. The goal of hashing is to learn a mapping $\Phi: \mathcal{X} \to \mathcal{H}^B$ such that similarities in the original space $\mathcal{X}$ are preserved in the B-dimensional Hamming space $\mathcal{H}^B$. The similarity can be induced from a particular metric or it can be derived from label information. A set of hash functions is utilized for the mapping, i.e., $\Phi(x) = [h_1(x), \ldots, h_B(x)]^T$ where each hash function $h_i(\cdot; \theta_i): \mathcal{X} \to \{-1, 1\}$ is responsible for the generation of one bit and $\theta_i$ is its associated parameter vector.

An ECOC matrix $\Lambda = \{c_1, \ldots, c_K\}^T$ is used, where each row or codeword $c_i \in \{-1, 1\}^B$ corresponds to a label. The binary code for a point x is the codeword c corresponding to the label for the point. If no label information is available, e.g. for a query point, it is taken to be $\Phi(x)$. Two distinct binary codes can be used to index a point x; the codeword c corresponding to its label (if available) or the output $\Phi(x)$. Given a query $x_q$, $\Phi(x_q)$ is computed and the instances can be retrieved according to Hamming rankings between the binary codes. Coupled with strong error-correcting properties of Λ, an indexing using codewords can have superior performance due to greater robustness to hash function errors during retrieval.

The disclosed technique employs ECOCs in an online setting, in which the hash functions are updated sequentially with incoming data. Moreover, no prior information on the label space $\mathcal{Y}$ is assumed, so the incoming instances may or may not be associated with previously observed labels. The method has to accommodate newly arrived data with its possibly never-seen labels. This is an essential feature given the ever-growing sizes of datasets and the inclusions of initially unknown classes.

Given an instance $(x^t, y^t)$, it is necessary to update the mapping $\Phi$. For simplicity, assume $|y^t|=1$, i.e., each data point is associated with a single label only. Let $\Lambda_y$ denote the corresponding codeword for $y^t$. $\Lambda_{yi} \in \{-1,1\}$ then denotes the binary label of $y^t$ in the $i^{th}$ bipartitioning. Generally, any type of hash functions can be used. The present description uses hyperplanes of the following form:

$$h(x;\theta)=\text{sgn}(w^T x - w_0), \quad (1)$$

where $\theta=[w^T; w_0]$. The goal is to solve the following problem:

$$\min_{\Theta=[\theta_1;\ldots;\theta_B]} \sum_{i=1}^{B} [\Lambda_{yi} \neq h_i(x^t; \theta_i)]_{0\backslash 1}, \quad (2)$$

where $\Theta$ is the concatenation of parameter vectors $\theta_i$. Replacing the 0\1 loss with a convex function l such as the exponential loss and dropping the non-differentiable sgn in Eq. 1, the objective function becomes convex and a technique such as stochastic gradient descent (SGD) can be used to minimize it. SGD has been successfully applied to large-scale learning problems as it provides huge memory savings and substantial computational time improvements.

As described more below, it may be helpful to consider independently updating each hash function $h_i$ for minimizing Eq. 2. Specifically, hashing $h_i$ is updated according to the following rule:

$$\theta_i^{t+1} \leftarrow \theta_i^t \eta^t \nabla_{\theta_i} l(h_i(x^t; \theta_i^t), \Lambda_{yi}), \quad (3)$$

where the learning rate $\eta^t$ is a positive real number.

Although the choice of $\Lambda$ is important, it is also important to address error-correlation among individual hash codes for retrieval performance. Even if the $\Theta$ that minimizes the objective function is found, errors made by the hash functions will typically be correlated; therefore, reducing this correlation is important for the success of an ECOC based algorithm. This problem may be tackled so as to handle error-correlation and take into account previous mappings when updating each hash function.

Formally, is updated as follows:

$$\theta_i^{t+1} \leftarrow \theta_i^t - \eta^t \nabla_{\theta_i} l(H_{i-1} + h_i(x^t; \theta_i^t); \Lambda_y), \quad (4)$$

where $H_{i-1} = \sum_{k=1}^{i-1} \Lambda_{yk} h_k(x^t; \theta_k^t)$.

With this approach, the error-correlation problem is handled in a way that is not possible when applying SGD on $\Theta$ directly.

When a new label is observed, a new codeword is assigned to it and the system proceeds with the update as usual. The codeword can be generated on-the-fly, but to further reduce the computational overhead it is helpful to construct a sufficiently large set of codewords or a codebook, beforehand. The performance of the method also depends on this construction, e.g., the distance between the codewords must be large enough to ensure error-correction. In practice, randomly constructing the binary codebook may perform better than using construction heuristics. Therefore, in one embodiment, random construction is used for codebook generation. This online method for learning the hash functions is summarized in Algorithm 1 below:

---

Algorithm 1: Online learning for hashing

Input : Streaming data $\{(x^t, y^t)\}_{t=1}^T$, Codebook C, η,
        function fetch (Λ,y) to obtain the codeword of y
        from code matrix Λ
        Initialize $\Theta$ = $[\theta_1,\ldots,\theta_B]$, k = 1
for t ← 1 to T do
  | If $y^t \not\subseteq \mathcal{Y}^t$ then
  |  | for each new label $\bar{y} \in y^t$ do
  |  |  | $\mathcal{Y}^t \leftarrow \{\mathcal{Y}^t, \bar{y}\}$
  |  |  | $\Lambda(k,:) \leftarrow$ random codeword c* from C
  |  |  | $\mathcal{C} \leftarrow \mathcal{C} \setminus c^*$
  |  |  | k ← k + 1
  |  | end
  | end
  | for each label $y \in y^t$ do
  |  | c ← fetch (Λ,y)   /* codeword assigned
  |  | to label y ($\Lambda_y$)  */
  |  |
  |  | for i ← 1 to B do
  |  |  | $\theta_i^{t+1} \leftarrow \theta_i^t - \eta^t \nabla_\Theta l(H_{i-1} + h_i(x^t; \theta_i^t); c)$
  |  | end
  | end
end

---

To populate the hash table after learning, a training point x may be indexed by using either the codeword c corresponding to its label (if available) or the output $\Phi(x)$. If the data points to be indexed have label information it is more convenient to use the corresponding codewords as the binary codes of the points, since it can compensate a number of hash function errors during retrieval and thus provide improved performance. Given a query $x_q$, $\Phi(x_q)$ is computed and the instances are retrieved via Hamming ranking between the binary codes.

Alternative Formulation, and Cycle-Based Updating

The biggest advantage of ECOCs is the error-correcting property, which enables recovery from hash function errors in computing the binary encoding.

Let $\mathcal{C} \subseteq \mathcal{H}^b$ denote a codebook. Usually the elements of $\mathcal{C}$, i.e., the codewords, ought to satisfy good error-correcting properties such as having ample bit differences. Each codeword $c \in \mathcal{C}$ will be assigned to a label in $\mathcal{Y}$. One intuitive way to preserve the semantic similarity is to minimize the Hamming distance between $\Phi(x)$ and its corresponding codeword $c_y$. Formally, it is desired to find $\Phi$ such that $d_h(\Phi(x), c_y)$ is minimized where $d_h(a,b)$ is the Hamming loss/distance between a and b. Hence, the objective can be formulated as:

$$J(\Phi) \triangleq \mathbb{E}_z[d_h(\Phi(x), c_y)] \triangleq \int_Z d_h(\Phi(x), c_y) dP(z). \quad (5)$$

It is desired to solve Eq. 5 in an online manner. This allows the computations to grow linearly with data input size, which is crucial given large-scale datasets.

The Hamming distance is defined as $d_h(\Phi(x),c_y)=\Sigma_t[[f_t(x)\neq c_{yt}]]$ where both $d_h$ and the functions $f_t$ are non-differentiable. Fortunately, $f_t$ can be relaxed by dropping the sgn function in Eq. 1 and deriving an upper bound on the Hamming loss. Note that $d_h(\Phi(x),c_y)=\Sigma_t\|f_t(x)\neq c_{yt}\|\leq\Sigma_t l(-c_{yt}w_t^T x)$ with a suitably selected convex margin-based function. Thus, by substituting this surrogate function into equation (5), $J(\Theta)(>J(\Phi))$ becomes convex where $\Theta^T=[w_1^T,\ldots,w_T^T]$. Therefore, this upper bound can be directly minimized using stochastic gradient descent:

$$\Theta^{t+1}\leftarrow\Theta_t-\eta_t\nabla_\Theta J(\Theta), \quad (6)$$

where $\eta_t>0$. For SGD, requiring $J(\Theta)$ to be a differentiable Lipschitz-function is sufficient for obtaining a regret bound that diminishes as $\mathcal{O}(1/\sqrt{T})$, where T is the iteration number.

Expanding and diversifying datasets are common in many practical problems. Hence, it is crucial that the mapping accommodates these variations. In the online setting, an incoming point may be associated with a previously observed class label or may even be associated with a new particular class label. The online framework allows the hash functions to be adapted with streaming data. If a new label is observed, a unique codeword from c is assigned to the label and proceed on with the minimization.

As discussed, the concept of adaptive hash functions is extremely appealing; though, it could require that all previously computed hash codes must be updated with every change of $\Phi$. Assume N b-length hash codes are already stored in an index. This requires updating Nb bit entries in the indexing structure. After T iterations a total of $\mathcal{O}(NbT)$ computations must be carried out to keep the index up to date. Although hash function evaluation is usually fast, if N is large and the index is partially stored on a disk, these computations may require disk access and become extremely inefficient. Hence, a solution that reduces hash bit entry updates in indexing is needed.

To address this issue ternary codewords $c_y\in\{-1,0,1\}^b$ may be used, where 0 denotes an inactive bit. As used in classification problems, the inactive bit allows us to avoid any changes to the corresponding (inactive) generator hash function. Formally, the Hamming distance $d_h$ now becomes $d_h(\Phi(x),c_y)=\Sigma_t\|f_t(x)\neq c_{yt}\||c_{yt}|\leq\Sigma_t l(-c_{yt}w_t^T x)|c_{yt}|$. Hence, as the inactive bits do not contribute to the Hamming distance, their partial derivative $\nabla_{w_t}J$ in Eq. 6 is 0.

The framework is online and the number of labels is not known a priori. Consequently, rather than fixing the code length parameter b, the binary codes may be grown or increased systematically with incoming data.

FIG. 4 shows an arrangement in which codewords $c_y$ corresponding to observed labels are stored as rows in an ECOC matrix $\Lambda$. A cycle in this method consists of observing $\rho$ new labels; for example, the first set of $\rho$ labels observed during learning constitute the first cycle. At the end of each cycle the matrix $\Lambda$ is altered by appending k inactive columns to the right. Let m denote the number of cycles so far. The next incoming newly observed label is assigned the ternary code $c_y=[0\ldots 0\bar{c}_y]$ with $(m-1)k$ inactive bits and a k-length binary codeword $\bar{c}_y\in\mathcal{C}$. Therefore, $\Lambda$ grows in both directions with streaming data. This is summarized in Algorithm 2 below.

---

Algorithm 2

--- input: Codebook $\mathcal{C}$, $\rho$, k, $\eta_t$, streaming inputs $(x^t, y^t)$, initialization procedure for a set of hash functions

---

Algorithm 2

--- init ( ), procedure find ($\Lambda$, y) to obtain the codeword of y from code matrix $\Lambda$, 1  $\Theta$ = init $(w_1, \ldots, w_k)$, m = 1, n = 1
2  for t ← 1, . . . , T do
3  | flag ← 0
4  | if $y^t \notin y$ then // A new label
5  | | flag ← 1
6  | | if n > $\rho$ then // A new cycle
7  | | | $\Lambda$ ← [$\Lambda$ $0^{\rho\times k}$]
8  | | | $\Theta$ = [$\Theta$ init $(w_{mk+1}, \ldots, w_{(mk+k)})$]
9  | | | m ← m + 1, n ← 1
10 | | else
11 | | | n ← n + 1
12 | end
13 | | $\bar{c}_y$ ← random codeword from $\mathcal{\hat{C}}$
14 | | $\mathcal{\hat{C}}$ ← $\mathcal{\hat{C}}\setminus\bar{c}_y$
   | | $(m-1)k$
15 | | $c_y$ ← $[\overbrace{0,\ldots,0}\ \bar{c}_y]$   /* Ternary code assigned to label y */
16 |
17 | | $\Lambda \leftarrow \begin{bmatrix}\Lambda\\c_y\end{bmatrix}$
18 | end
19 | if flag = 0 then $c_y$ ← find ($\Lambda$, y);
20 |
21 | $\Theta^{t+1} \leftarrow \Theta^t - \eta_t\nabla_\Theta J(\Theta; c_y)$   // Update
22 |
23 end Algorithm 2 requires user-specified choices for $\mathcal{C}$, $\rho$ and k. The performance may not critically depend on delicate parameter choices.

Central to the method is the codebook $\mathcal{C}$, where its elements $\bar{c}_y\in\{-1,1\}^k$ are used to construct target hash codes for the mappings. Though these binary codes can be computed on the fly with demand, it is more appropriate to construct them offline to reduce online computations. These codes ought to have good row and column separation properties. A randomly generated codebook may be used, which is simple to construct and may perform better compared to other heuristics.

Though no prior information is assumed for the label space, let L denote the total number of labels that are anticipated. During learning, the ternary codewords are constructed from codes sampled from the binary codebook $\mathcal{C}$. Since the inactive bits in the ternary codewords do not contribute to the Hamming distance, the binary codes $\bar{c}_y\in\mathcal{C}$ instead must have ample bit differences. To ensure this property, codebook $\mathcal{C}$ must have a sufficiently large number of codes. Specifically, $2^k\geq L$ must be satisfied where k is the length of $\bar{c}_y$. This is a mild requirement given the common choices of k (k=32, 64, . . . ) which work well in practice.

Another situation to avoid is $\rho<\log k$, as this can lead to identical columns (bipartitions) in a cycle. To examine why it is necessary that $\rho\geq\log k$, consider the codewords assigned to $\rho$ labels in a particular cycle. Ignoring the inactive bits, notice that the columns denote bipartitions of the data based on labels in which the hash functions can be considered as dichotomizers. Eq. 5 can be reorganized by interchanging the integral and sum, yielding $$J(\Theta) = \sum_t \int_z l(-c_{yt}w_t^T x)dP(z).$$

Hence, with the upper bound, minimizing the Hamming loss between the target hash codes $c_y$ and the mapping $\Phi(x)$ can be viewed as minimizing the sum of expected losses or the binary classification errors. If identical bipartitions exist then the learned dichotomizers will be highly correlated as the classification error of each dichotomizer will independently be minimized based on these same bipartitions (data splits).

In general, k must be selected so that the inequality $2^k \geq L \geq \rho \geq \log k$ holds. For randomly generated $\rho$ codes of k-length, the probability that all bipartitions are unique is $$\frac{2^{\rho}!}{(2^{\rho}-k)!2^{\rho k}}.$$

Thus, a good choice for $\rho$ might be 4 log k where this probability is $\geq 0.9$ for common choices of k.

As previously mentioned, a point x may be indexed by either using its corresponding codeword $c_y$ (if label information exists) or by using the output of the mapping, i.e., $\Phi(x)$. FIG. 4 shows that, using ternary codewords, the inactive bits do not contribute to the Hamming distance (only highlighted areas are compared).

After learning the mapping $\Phi$, the hash table can be populated by either indexing a point x using its corresponding codeword $c_y$ in $\Lambda$ or by using the output of the mapping, i.e., $\Phi(x)$. Given a query $x_q$, $\Phi(x_q)$ is computed and instances are ranked based on the Hamming distances between the binary codes. Note that $\Phi(x) \in \{-1,1\}^b$ while the hash codes of the points are ternary, as described above. Even with ternary codes, the Hamming distance computation can be carried out with the same efficiency by masking out the inactive bit positions.

If the point to be indexed has label information y, then using the corresponding codeword as its binary code may perform better. Instances can be ranked by merely computing the Hamming distance between the test query code $\Phi(x_q)$ and the codewords. Since the number of codewords is usually much smaller than the number of instances, this is much more efficient and the ECOC error-correcting property also allows a number of hash function errors to be compensated for during this retrieval. Moreover, since the hash table is populated via codewords c, an update to previously stored entries is not required when the mapping $\Phi$ is changed. This is an important property for an adaptive hashing technique since updating the index for each change in the hash mapping might be computationally infeasible for large structures.

However, label information may not always be available. In such a case, $\Phi$ can be used to compute the binary code of an instance. However, such codes must be accommodated to the changes to $\Phi$; thus, reducing this need to update the hash table becomes essential. This may be done by allocating sets of hash functions to sets of classes with the usage of ternary codewords as explained above.

Efficient Updating Using Regularization and Reservoir Set

This section presents alternative techniques for more efficiently updating the index structure. This issue can be addressed using two techniques. First, the online updates are regularized to reduce binary code re-computations. This is formulated by considering the expected number of bit changes that might occur for a change in the mapping. This expectation is approximated via a method known as reservoir sampling that maintains a subset of data items (reservoir set) sampled from the streaming data. In this manner, it is ensured that successive updates to the hash mapping are proximal in terms of their output. Secondly, at each step the binary codes are re-computed only if the number of bit changes in the reservoir set exceeds a threshold value, which may be set dynamically. Combined, these two techniques may significantly reduce the need to re-hash data during the online learning process.

As noted above, a difficulty in optimizing Eq. 5 above is that the Hamming distance, defined as $d_H(\Phi(x),c_y) = [\text{sgn}(w_i^T x) \neq (c_{yi})]$, is not differentiable or continuous. Instead a convex surrogate $\hat{d}_l$ that avoids use of the sgn function can be optimized on the Hamming loss: $\hat{d}_l(\Phi(x),c_y) \triangleq \Sigma_i l(-c_{yi} w_i^T x) \geq \Sigma_i \|\text{sgn}(w_i^T x) \neq c_{yi}\|$, where l is a suitably selected margin-based loss. As an example, l is chosen to be the hinge loss.

Finally, with an observed training set $\{(x_t, y_t)\}$, the empirical risk minimization (ERM) problem then becomes:

$$\Phi^* = \text{argmin}_\Phi \sum_t \hat{d}_l(\Phi(x_t), c_{y_t}) \quad (7)$$

Thus, by substituting this surrogate function into Eq. 5, $J(\Phi)$ becomes a convex where $\Theta^T = [w_1^T, \ldots, w_T^T]$.

Reducing Re-Hashing Using Regularization

It is desired to solve Eq. 7 in an online manner, processing examples incrementally over time. This allows the computational complexity to grow linearly with data size, which is important in large-scale settings. As discussed above, the concept of adaptive hash functions is very appealing, although applying online updates to the hash functions could require the hash table to be updated with every change of $\Phi$.

As above, let us define a "hash table" or "index" for a set of examples $\{x_1, \ldots, x_N\}$ to be the collection of their binary codes $\{\Phi(x_1), \ldots, \Phi(x_N)\}$ computed with respect to hash functions $\Phi$. Assume a total of N b-bit hash codes already stored in an index. An update requires updating Nb bit entries in the indexing structure. After T iterations, a total of $\mathcal{O}(NbT)$ operations must be carried out to keep the binary representations up to date. Although hash function evaluation is usually fast, if N is large and the index is partially stored on a disk, these operations may become extremely inefficient.

For online optimization of Eq. 7, one solution may be to perform stochastic gradient descent (SGD). However, a drawback of SGD is that it lacks the ability to properly regularize successive updates, meaning that a large number of binary code changes could still occur across update steps. Although enforcing a small step-size in SGD has the effect of keeping the next solution $\Phi_{t+1}$ close to $\Phi_t$, doing so may not correctly reflect the desired geometry, and may artificially slow down the learning process.

Instead, online updates of the following form may be used:

$$\Phi_{t+1} = \text{arg min}_\Phi \hat{d}_l(\Phi(x),c_y) + \lambda \mathcal{R}(\Phi,\Phi_t), \quad (8)$$

where there is minimization of a surrogate loss with respect to a stochastic example revealed at time t+1, together with a regularization function $\mathcal{R}$. $\lambda$ is a weighting parameter.

The regularization function $\mathcal{R}$ needs to encode a certain measure of divergence between the previous hash functions $\Phi_t$ and the new ones. $\mathcal{R}$ essentially should act as a proxy for the differences in the resulting hash tables before and after online updates to the hash functions.

Expanding and diversifying datasets are common in many practical problems. Hence, it is important that the mapping accommodates these variations. In the online setting, an incoming point may be associated with a previously observed class label or may even be associated with a new particular class label. The online framework allows the hash functions to be adapted with streaming data. If a new label is observed, unique codeword from $\mathcal{C}$ is assigned to the label and the minimization proceeds.

The regularizer $\mathcal{R}$ penalizes a new solution that requires a large number of binary code re-computations. A useful indicator is that one can conveniently measure the difference between two hash tables (corresponding to two different sets of hash functions) by the expected number of bit differences between two hash tables computed on the same set of data.

Assume the Hamming space $\mathcal{H}$ is populated with an infinite amount of data items sampled from $\mathcal{Z}$. A re-computation of a hash code is required when bit flips occur in the code due to changes in the hash mapping. Formally, the expected number of bit flips occurring between mappings $\Phi$ and $\Phi_t$ is $\mathbb{E}_{\mathcal{Z}}[d_h(\Phi(x), \Phi'(x))]$.

Using the expected number of bit flips as the regularizer $\mathcal{R}$, the single-step objective Eq. 8 now becomes:

$$\Phi_{t+1} = \arg\min_\Phi \hat{d}_l(\Phi(x), c_{y_t}) + \lambda \mathbb{E}_{\mathcal{Z}}[d_h(\Phi(x), \Phi'(x))]. \quad (9)$$

During online learning, the goal is to minimize or control the number of bit flips to the hash table across iterations, while minimizing the target loss.

Dynamic Regularizer Based on Reservoir Sampling

This subsection empirically approximates the expectation term in Eq. 9. In the batch setting, this can be achieved as long there is a set of i.i.d. samples from $\mathcal{Z}$. However, during online learning the challenge is how to obtain uniformly random samples from an incoming stream of data.

A solution known as reservoir sampling is used. It is a family of randomized algorithms to sample from a set of items in which the cardinality of the set is too large or unknown. It can be used to provide a Monte-Carlo approximation of the expectation in Eq. 9 in terms of the average number of bit flips incurred in the reservoir. This reservoir set of examples is maintained and updated in each iteration. Thus reservoir sampling is relied upon to maintain a representative subset of the data observed thus far, thereby approximating the expectation without any need to access the potentially large index structure.

Formally, let $\mathcal{S}_t = \{\bar{x}_1^t, \ldots, \bar{x}_S^t\}$ denote the reservoir at time t. After applying the convex surrogate $\hat{d}_l$ on the Hamming distance $d_h$ (recall that $d_h$ is non-differentiable and non-continuous), a tractable version of Eq. 9 is obtained:

$$\Phi_{t+1} = \arg\min_\Phi \hat{d}_l(\Phi(x_t), c_y) + \lambda \sum_{i=1}^{S} \hat{d}_l(\Phi_t(\bar{x}_i^t), \Phi_t(\bar{x}_i^t)). \quad (10)$$

Eq. 10 is what will actually be solved in practice. The first term emphasizes a correct mapping of x to its target code $c_y$, while the second term puts a penalty on the amount deviation to the previous hash mapping based on the reservoir $\mathcal{S}_t$. Thus the regularizer is a dynamic regularizer that changes along with the updates to the reservoir set. A surrogate convex function is used to upper-bound the non-differentiable regularizer.

Although Eq. 10 already ensures that successive update steps for $\Phi$ are proximal in terms of their output, ensuring an overall reduction in the expected number of bit flips, the question of when to actually perform hash table updates is still open. This can also be addressed using the reservoir. Due to the reservoir sampling, the hash codes or hash table of $\mathcal{S}$ is a noisy but unbiased estimate for the hash table of the entire data stream. Assuming that the reservoir set is small and can fully reside in memory, after each update to the hash functions, the reservoir hash table can be updated efficiently. Changes in this table can serve as indicators of whether the binary codes in the actual hash table are outdated and require re-computing.

For this purpose a predetermined threshold value may be used, which may be static or dynamic. If the number of bit changes in the reservoir set exceeds the threshold, the hash table is updated. There can be numerous ways to establish a threshold, which may be application-specific. A particular dynamic threshold is described below that is used with the ECOC based hashing formulation. Other types of thresholds may be used, independent of whether the ECOC based hashing formulation is used. As an example, a static threshold is generally independent of the hashing formulation.

A dynamic threshold value may be used that is based on the number of class labels seen thus far. After an update occurs in both the hash mapping and the reservoir hash table, it is determined whether the average number of bit changes in reservoir hash table exceeds this threshold. The hash codes are only re-computed in the actual index if the dynamic threshold is exceeded, thereby further reducing the amount of binary re-computations.

Regarding the dynamic threshold value, the following proposition can be provided:

Proposition 1:

If $d_h(\Phi_t(x), c_y) = 0$ for $\forall (x, y) \in \mathcal{Z}$, the expected minimum Hamming distance $\rho$ is independent from the number of items in an index and is given as $$\rho \triangleq \sum_{r=1}^{b} r\left(\prod_{l=1}^{L-1}\left(1 - \frac{B(b, r-1)}{2^b} l\right) - \prod_{l=1}^{L-1}\left(1 - \frac{B(b, r)}{2^b} l\right)\right),$$

where L and B(b,r) are the number of labels observed thus far and the amount b-length binary codes in hamming ball with radius r, respectively.

The above proposition states that, if the hash mapping ideally outputs the target code of the underlying (possibly hidden) label, then the expected minimum Hamming distance of the hashed codes in a hash table, $\rho$, is only a function of the number of observed labels.

This value can be used as a threshold to determine whether to update the hash table.

In each iteration, an update to the actual hash table is done only if the following is satisfied:

$$\frac{1}{|\mathcal{S}_t|} \sum_{s=1}^{|\mathcal{S}_t|} d_h(\Phi_{t+1}(\bar{x}_s^t), \Phi_t(\bar{x}_s^t)) \geq \rho/2.$$

Practically, the hash functions will not be perfect, i.e., $d_h(\Phi(x),c_y)$ will be non-zero, hence this value is an optimistic upper-bound.

Algorithmic Details

ECOC Codes

The online algorithm is able to adapt to variations in streaming data. An important aspect of that is, no prior information on the label space $\mathcal{Y}$ is assumed, but instead a record is kept of the observed labels as the algorithm progresses. This can deal with ever-growing datasets where new labels may become available later on.

A set $\mathcal{L}$ is kept of observed labels at any point during online learning.

To assign binary target codes to observed labels, the availability of a codebook $\mathcal{C}$ is assumed, which contains ECOCs that are pre-computed or computed on-the-fly. Each time a new label y is observed, a new codeword from $\mathcal{C}$ is assigned to y. A codeword matrix M is also maintained that contains target codes for all seen labels in $\mathcal{L}$.

Approximate Online Updates

To further improve the efficiency of the algorithm, instead of solving the update equation Eq. 10 exactly, one may resort to approximate solutions in practice. It has been found that just taking a single gradient descent step on Eq. 10 retains good results, but with significant speedups. Because the loss term in Eq. 10 is defined with respect to a single stochastic sample, this approximate strategy can also be regarded as a modified SGD step, reweighted by the contribution from the reservoir.

Algorithm Pseudocode

Pseudo-code for the overall algorithm in Algorithm 3, and the reservoir sampling algorithm in Algorithm 4.

---

Algorithm 3: Dynamic Online Supervised Hashing

--- input : Codebook C,λ,streaming inputs $(x_t,y_t)$, procedure init( ) to initialize hash functions, procedure find( ) to obtain the target code of y from code matrix M 1  $\phi_0$ = init($w_1,...,w_k$) // hash functions
2  $\mathcal{S} \leftarrow \emptyset$ // reservoir set
3  C ← ∅ // class labels seen so far
4  for t ← 1,...,T do
5    | if $y_t \notin \mathcal{L}$ then // A new label
6    |   | $c_y$ ← random codeword from C
7    |   | C ← C\\$c_y$
8    |   | M ← [M,$c_y$]
9    | else
10   |   | $\mathcal{L} \leftarrow \{y_t\} \cup \mathcal{L}$
11   |   | $c_y$ ← find(M,y)
12   | end
13   | Solve for $\phi_t$ with Eq. 6
14   | Compute p from Eq. 7
15   | if $1/|S| \; \Sigma_{s=1}^{|S|} d_h (\phi_t(\bar{x}_s),\phi_{t-1}(\bar{x}_s)) \geq$ p then
16   |   | Recompute hash table with mapping $\phi_t$
17   | end
18   | S ← Update_Reservoir_Set(S,$x_t$,t,max_size)
19 end

---

Algorithm 4: Update Reservoir Set

--- input : Reservoir set S,$x^t$,t, max_size
1 if t ≤ max_size then // Initial stage
2   | r ~ U[0,1]
3   | S.push($x_t$,r)
4 else
5   | (x,priority) ← S.pop( ) // pop item with highest priority
6   | r ~ U[0,1]
7   | if priority > r then

---

Algorithm 4: Update Reservoir Set

---

8   |   | S.push($x_t$,r) // randomly accept new point
9   | else
10   |   | S.push(x,priority)
11   | end
12 end

---

As noted, in some embodiments either x or y may be omitted from some operations. The basic formulation assumes that the dataset is at least partially supervised, which allows for the possibility that not all stored items are labelled. In particular, pairs (x,y) may be inserted especially for training hash mappings, while unlabeled items of the form x may also be inserted using the learned hash mappings. That is, such items are indexed according to the mapping $\Phi(x)$ only, as the lack of a label y prevents use of label-associated codewords. As explained above, it may be preferable to index items according to labels when available. Queries may be done based on x alone, y alone, and/or a combination of x and y. The result of a query may inform a subsequent insertion. For example, if a query for an item $x_1$ returns one or more items bearing a label $y_t$, then the item $x_1$ might inherit that label if/when $x_1$ is subsequently inserted into the dataset. A query based on y alone will typically return all items bearing the corresponding label. A query based on both x and y may be implemented by some manner of sorting/merging two sets of results, one based on x and the other based on y.

The technique may alternatively operate without supervision over a label space Y (unlabeled data); in such a case, the hash functions may instead be trained using partitions over the input space X.

While various embodiments of the invention have been particularly shown and described, it will be understood by those skilled in the art that various changes in form and details may be made therein without departing from the spirit and scope of the invention as defined by the appended claims.

What is claimed is:

1. A data storage and retrieval system, comprising:
a storage subsystem for storing a dataset of content items, at least some of the content items of the dataset being labelled content items having respective labels describing respective aspects of the content items; and
a processing subsystem coupled to the storage subsystem and having a communications interface coupled to receive additions to the dataset and queries of the dataset, the processing subsystem being configured and operative to:
maintain an index of the content items using hash codes and predetermined codewords as index values, the hash codes being dynamically generated by an online-learned hash-based mapping, the codewords representing respective labels of the labelled content items of the dataset, the codewords being error-correcting codes protecting against errors in the hash-based mapping and promoting selectivity of the hash codes produced by the hash-based mapping;
maintain and dynamically update the hash-based mapping, and use the hash-based mapping to generate the hash codes as content items of the dataset are indexed, the hash-based mapping preserving semantic similarities of content items, the hash-based mapping being updated using an objective function of distance between the hash codes produced by the hash-based mapping and respective codewords for the labelled content items; and search the index to retrieve stored content items in response to the queries received via the communications interface, including (i) using the hash-based mapping to calculate a query hash code from a content item of the query, and (ii) using the query hash code to retrieve stored content items indexed by similar codewords or hash codes;

wherein the processing subsystem performs a randomized reservoir sampling method that (i) maintains a reservoir sampling set of randomly selected content items and associated labels as they are added to the dataset during operation, (ii) uses the reservoir sampling set to determine when to update the index, and (iii) updates the index at determined times.

2. The data storage and retrieval system of claim 1, wherein to maintain the hash-based mapping the processing subsystem performs a calculation minimizing an upper bound on a Hamming loss between the hash codes and the codewords.

3. The data storage and retrieval system of claim 1, wherein to determine when to update the index, the processing subsystem performs a calculation comparing a measure of an amount of change of the hash codes of the reservoir to a predetermined threshold value.

4. The data storage and retrieval system of claim 3, wherein the threshold is a dynamic threshold adapted based on the number of labels observed in preceding operation.

5. The data storage and retrieval system of claim 1, wherein to maintain the hash-based mapping the processing subsystem evaluates a regularizer term in addition to the objective function of distance, the regularizer term encoding a measure of divergence between a current hash-based mapping and a candidate new hash-based mapping, to promote selection of a new hash-based mapping requiring less updating of the index than other candidate new hash-based mappings.

6. The data storage and retrieval system of claim 5, wherein the processing subsystem uses the reservoir sampling set to evaluate the regularizer term.

7. The data storage and retrieval system of claim 6, wherein the processing subsystem also uses the reservoir sampling set to determine when to update the index, and updates the index at determined times.

8. The data storage and retrieval system of claim 7, wherein to determine when to update the index, the processing subsystem performs a calculation comparing a measure of an amount of change of the hash codes of the reservoir to a predetermined threshold value.

9. The data storage and retrieval system of claim 8, wherein the threshold is a dynamic threshold adapted based on the number of labels observed in preceding operation.

10. The data storage and retrieval system of claim 1, wherein to maintain the index and maintain the hash-based mapping, the processing subsystem performs ongoing processes divided into cycles during each of which a number of new labels are learned and corresponding content items are stored, both the hash-based mapping and the index being divided into sections corresponding to the cycles during which respective hash functions and codewords of the sections were first created and stored therein, the processes including, at a time of updating the hash-based mapping and the index based on adding a new labelled content item to the dataset:

identifying respective sections of the hash-based mapping and index structure corresponding to a codeword for a label of the labelled content item; and updating the identified sections.

11. The data storage and retrieval system of claim 10, wherein the codewords comprise ternary symbols including an inactive value, and wherein, to update the identified sections, the processing subsystem also updates other sections of the index structure by appending a series of symbols having the inactive value to existing symbols of existing hash codes.

12. A method of operating a data storage and retrieval system storing a dataset of content items, at least some of the content items of the dataset being labelled content items having respective labels describing respective aspects of the content items, the data storage and retrieval system having a communications interface for receiving additions to the dataset and queries of the dataset, comprising:

maintaining an index of the content items using hash codes and predetermined codewords as index values, the hash codes being dynamically generated by an online-learned hash-based mapping, the codewords representing respective labels of the labelled content items of the dataset, the codewords being error-correcting codes protecting against errors in the hash-based mapping and promoting selectivity of the hash codes produced by the hash-based mapping;

maintaining and dynamically updating the hash-based mapping, and using the hash-based mapping to generate the hash codes as content items of the dataset are indexed, the hash-based mapping preserving semantic similarities of content items, the hash-based mapping being updated using an objective function of distance between the hash codes produced by the hash-based mapping and respective codewords for the labelled content items;

searching the index to retrieve stored content items in response to the queries received via the communications interface, including (i) using the hash-based mapping to calculate a query hash code from a content item of the query, and (ii) using the query hash code to retrieve stored content items indexed by similar codewords or hash codes; and randomized reservoir sampling that includes (i) maintains a reservoir sampling set of randomly s elected content items and associated labels as they are added to the dataset during operation, (ii) uses the reservoir sampling set to determine when to update the index, and (iii) updates the index at determined times.

13. The method of claim 12, wherein maintaining the hash-based mapping includes minimizing an upper bound on a Hamming loss between the hash codes and the codewords.

14. The method of claim 12, further including, to determine when to update the index, performing a calculation comparing a measure of an amount of change of the hash codes of the reservoir to a predetermined threshold value.

15. The method of claim 14, wherein the threshold is a dynamic threshold adapted based on the number of labels observed in preceding operation.

16. The method of claim 12, wherein maintaining the hash-based mapping includes evaluating a regularizer term in addition to the objective function of distance, the regularizer term encoding a measure of divergence between a current hash-based mapping and a candidate new hash-based mapping, to promote selection of a new hash-based mapping requiring less updating of the index than other candidate new hash-based mappings.

17. The method of claim 16, further including using the reservoir sampling set to evaluate the regularizer term.

18. The method of claim 17, further including using the reservoir sampling set to determine when to update the index, and updates the index at determined times.

19. The method of claim 18, wherein to determine when to update the index includes performing a calculation comparing a measure of an amount of change of the hash codes of the reservoir to a predetermined threshold value.

20. The method of claim 19, wherein the threshold is a dynamic threshold adapted based on the number of labels observed in preceding operation.

21. The method of claim 12, wherein maintaining the index and maintaining the hash-based mapping are ongoing processes divided into cycles during each of which a number of new labels are learned and corresponding content items are stored, both the hash-based mapping and the index being divided into sections corresponding to the cycles during which respective hash functions and codewords of the sections were first created and stored therein, and further including, at a time of updating the hash-based mapping and the index based on adding a new labelled content item to the dataset:
   identifying respective sections of the hash-based mapping and index structure corresponding to a codeword for a label of the new labelled content item; and
   updating the identified sections.

22. The method of claim 21, wherein the codewords comprise ternary symbols including an inactive value, and further including, upon updating the identified sections, also updating other sections of the index structure by appending a series of symbols having the inactive value to existing symbols of existing hash codes.

23. A data storage and retrieval system, comprising:
   a storage subsystem for storing a dataset of content items, at least some of the content items of the dataset being labelled content items having respective labels describing respective aspects of the content items; and
   a processing subsystem coupled to the storage subsystem and having a communications interface coupled to receive additions to the dataset and queries of the dataset, the processing subsystem being configured and operative to:
      maintain an index of the content items using hash codes and predetermined codewords as index values, the hash codes being dynamically generated by an online-learned hash-based mapping, the codewords representing respective labels of the labelled content items of the dataset;
      maintain and dynamically update the hash-based mapping, and use the hash-based mapping to generate the hash codes as content items of the dataset are indexed, the hash-based mapping preserving semantic similarities of content items, the hash-based mapping being updated using an objective function of distance between the hash codes produced by the hash-based mapping and respective codewords for the labelled content items;
      search the index to retrieve stored content items in response to the queries received via the communications interface, including (i) using the hash-based mapping to calculate a query hash code from a content item of the query, and (ii) using the query hash code to retrieve stored content items indexed by similar codewords or hash codes,
   wherein maintaining the index includes randomized reservoir sampling that includes (i) maintaining a reservoir sampling set of randomly selected content items and associated labels as they are added to the dataset during operation, (ii) using the reservoir sampling set to determine when to update the index, and (iii) updating the index at determined times.

* * * * *